US009052985B2

(12) United States Patent
Gopal et al.

(10) Patent No.: US 9,052,985 B2
(45) Date of Patent: Jun. 9, 2015

(54) METHOD AND APPARATUS FOR EFFICIENT PROGRAMMABLE CYCLIC REDUNDANCY CHECK (CRC)

(75) Inventors: Vinodh Gopal, Westborough, MA (US); Erdinc Ozturk, Worcester, MA (US); Gilbert M. Wolrich, Framingham, MA (US); Wajdi K. Feghali, Boston, MA (US)

(73) Assignee: Intel Corporation, Santa Clara, CA (US)

( * ) Notice: Subject to any disclaimer, the term of this patent is extended or adjusted under 35 U.S.C. 154(b) by 1475 days.

(21) Appl. No.: 11/963,147

(22) Filed: Dec. 21, 2007

(65) Prior Publication Data

US 2009/0164546 A1 Jun. 25, 2009

(51) Int. Cl.
*G06F 7/72* (2006.01)
*H03M 13/09* (2006.01)

(52) U.S. Cl.
CPC ........ *G06F 7/724* (2013.01); *G06F 7/72* (2013.01); *H03M 13/09* (2013.01)

(58) Field of Classification Search
CPC ....... G06F 7/49931; G06F 7/72; H03M 13/09
USPC ................................. 708/491, 492; 714/781
See application file for complete search history.

(56) References Cited

U.S. PATENT DOCUMENTS

| 5,166,978 | A | 11/1992 | Quisquater |
| 6,609,410 | B2 | 8/2003 | Axe et al. |
| 7,461,115 | B2 | 12/2008 | Eberle et al. |
| 7,827,471 | B2 * | 11/2010 | Hasenplaugh et al. ........ 714/781 |
| 7,886,214 | B2 * | 2/2011 | Gopal et al. ................... 714/781 |
| 2002/0144208 | A1 | 10/2002 | Gallezot et al. |
| 2003/0212729 | A1 | 11/2003 | Eberle et al. |
| 2007/0083585 | A1 | 4/2007 | St Denis et al. |
| 2007/0297601 | A1 * | 12/2007 | Hasenplaugh et al. ......... 380/28 |
| 2008/0092020 | A1 | 4/2008 | Hasenplaugh et al. |

FOREIGN PATENT DOCUMENTS

| WO | 2009/085489 A2 | 7/2009 |
| WO | 2009/085489 A3 | 8/2009 |

OTHER PUBLICATIONS

Hasenplaugh et al., "Fast Modular Reduction", IEEE, Jun. 2007, 5 pages.*
Nedjah, N. et al., "A Review of Modular Multiplication Methods ands Respective Hardware Implementation", Informatica, vol. 30, No. 1, 2006.
Nedjah, N. et al., "A reconfigurable recursive and efficient hardware for Karatsuba-Ofman's multiplication algorithm", Proceedings of 2003 IEEE Conference on Control Applications, vol. 2, Jun. 23-25, 2003.

(Continued)

*Primary Examiner* — Chuong D Ngo
(74) *Attorney, Agent, or Firm* — Lowenstein Sandler LLP (57) ABSTRACT

A method and apparatus to optimize each of the plurality of reduction stages in a Cyclic Redundancy Check (CRC) circuit to produce a residue for a block of data decreases area used to perform the reduction while maintaining the same delay through the plurality of stages of the reduction logic. A hybrid mix of Karatsuba algorithm, classical multiplications and serial division in various stages in the CRC reduction circuit results in about a twenty percent reduction in area on the average with no decrease in critical path delay.

15 Claims, 7 Drawing Sheets

(56) References Cited

OTHER PUBLICATIONS

International Search Report/Written Opinion for Patent Application No. PCT/US2008/084571, mailed Jun. 18, 2009, 11 pages.
Barrett: Implementing the Rivest Shamir and Adleman Public Key Encryption Algorithm on a Standard Digital Signal Processor: Computer Security Ltd Aug. 1986, 13 pages. (Crypto '86, LNCS 263, pp. 311-323, 1987: copyright Springer-Verlag Brlin Heidelberg 1987).
Dhem: Design of an Efficient Public-Key Cryptographic Library for RISC-Based Smart Cards; Faculte Des Sciences appliquees Laboratoire de Microelectronique: Louvain-la-Neuve, Belgium, May 1998, 198 pages.
Koc et al.: Analyzing and Comparing Montgomery Multiplication Algorithms; IEEE Micro, 16(3): 26-33, Jun. 1996; Dep't of Electrical and Computer Engineering, OSU, Corvallis, Oregon,; pp. 1-18.
Montgomery: Five, Six, and Seven-Term Karatsuba-Like Formulae; IEEE Transactions on Computers, vol. 54, No. 3, Mar. 2005, 8 pages.
Montgomery: Modular Multiplication Without Trial Division; Mathematics of Computation, vol. 44, No. 170, Apr. 1985, pp. 519-521.
Number Theory and Public Key Cryptography; Introduction to Number Theory, pp. 1-14, 2006.
Sedlak: The RSA Cryptography Processor; Institut fur Theoretische Informatik, Germany. Copyright 1998, Springer-Verlag, pp. 95-105, 14 pages total.
Tenca et al.: A Scalable Architecture for Montgomery Multiplication; Electrical and Computer Engineering; OSU, Corvallis, OR,; Cryptographic Hardware and Embedded Systems, CHES 99, C.K. Koc et al, Lecture Notes in Computer Science, No. 1717, pp. 94-108, New York, NY: Springer-Verlag, 1999.
Weimerskirch et al.: Generalizations of the Karatsuba Algorithm for Polynomial Multiplication; Communication Security Group, Dep't of Electrical Engineering and Information Sciences, Bochum, Germany, Mar. 2002; pp. 1-23.
Ramabadran et al.: A Tutorial on CRC Computations; Aug. 1998 IEEE (Dep't of EE and CE, Iowa), pp. 62-74, 14 pages total.
Lin et al.: High-Speed CRC Design for 10 Gbps applications; ISCAS 2006, IEEE, (Dep't of Electrical Engineering, Taiwan, ROC), pp. 3177-3180, 4 pages total.
Williams: A Painless Guide to CRC Error Detection Algorithms Version 3; Aug. 19, 2003; Copyright Ross Williams, 1993; 37 pages.
Sprachmann: Automatic Generation of Parallel Circuits; IEEE Design and Test of Computers May-Jun. 2001; pp. 108-114, 7 pages total.
Koopman et al.: Cyclic Redundancy Code (CRC) Polynomial Selection for Embedded Networks; Preprint: The In'tl Conference on Dependable Systems and Networks, DSN-2004 pp. 1-10.
Campobello et al.: Parallel CRC Realization; IEEE Transactions on Computers, vol. 52, No. 10, Oct. 2003; Published by the IEEE Computer Society; pp. 1312-1319, 8 pages total.
Kounavis et al.: A Systematic Approach to Building High Performance Software-based CRC Generators; Proceedings of the 10th IEEE Symposium on Computers and Communications (ISCC 2005); 8 pages.
International Preliminary Report on Patentability and Written Opinion received for PCT Application No. PCT/US2008/084571 mailed on Jul. 1, 2010, 6 pages.
Fischer et al., "Duality Between Multiplication and Modular Reduction", Infineon Technologies AG, Secure Mobile Solutions, Munich, Germany, Intel Corporation, Systems Technology Laboratory, Hillsboro, OR, 2005, pp. 1-13.
Phatak et al., "Fast Modular Reduction for Large Wordlengths via One Linear and One Cyclic Convolution", Computer Science and Electrical Engineering Department, University of Mayland, Baltimore, MD 2005, 8 pages.

* cited by examiner

METHOD AND APPARATUS FOR EFFICIENT PROGRAMMABLE CYCLIC REDUNDANCY CHECK (CRC)

FIELD

This disclosure relates to error checking and in particular to use of Cyclic Redundancy Check for error checking.

BACKGROUND

A polynomial is a mathematical expression of one or more algebraic terms, for example, "a+bx+cx$^2$", each of which consists of a constant (a, b or c) multiplied by one or more variables (x) raised to a nonnegative integral power. A fixed size remainder of binary division of a data block by an n-bit polynomial may be used to verify that there were no transmission errors when transmitting the data block from a source to a destination. An n-bit polynomial applied to a data block of arbitrary length detects any single error burst that is less than or equal to n bits.

The fixed size remainder is computed for a data block at a source and is transmitted with the data block. The n-bit polynomial is applied to the received data block at the destination to re-compute the fixed size remainder and the recomputed fixed size remainder is compared with the fixed size remainder transmitted with the data block to verify that there were no transmission errors.

A Cyclic Redundancy Check (CRC) is a term that is given to both a fixed size remainder (a residue of binary division of an arbitrary length data block by a fixed size polynomial) and the function to produce the fixed size remainder. There are a plurality of n-bit polynomials that are used to compute a CRC. Most commonly used CRCs use the Galois finite field GF (2) having a finite field of two elements, 0 and 1.

BRIEF DESCRIPTION OF THE DRAWINGS

Features of embodiments of the claimed subject matter will become apparent as the following detailed description proceeds, and upon reference to the drawings, in which like numerals depict like parts, and in which:

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined only as set forth in the accompanying claims.

DETAILED DESCRIPTION

Figure 1:
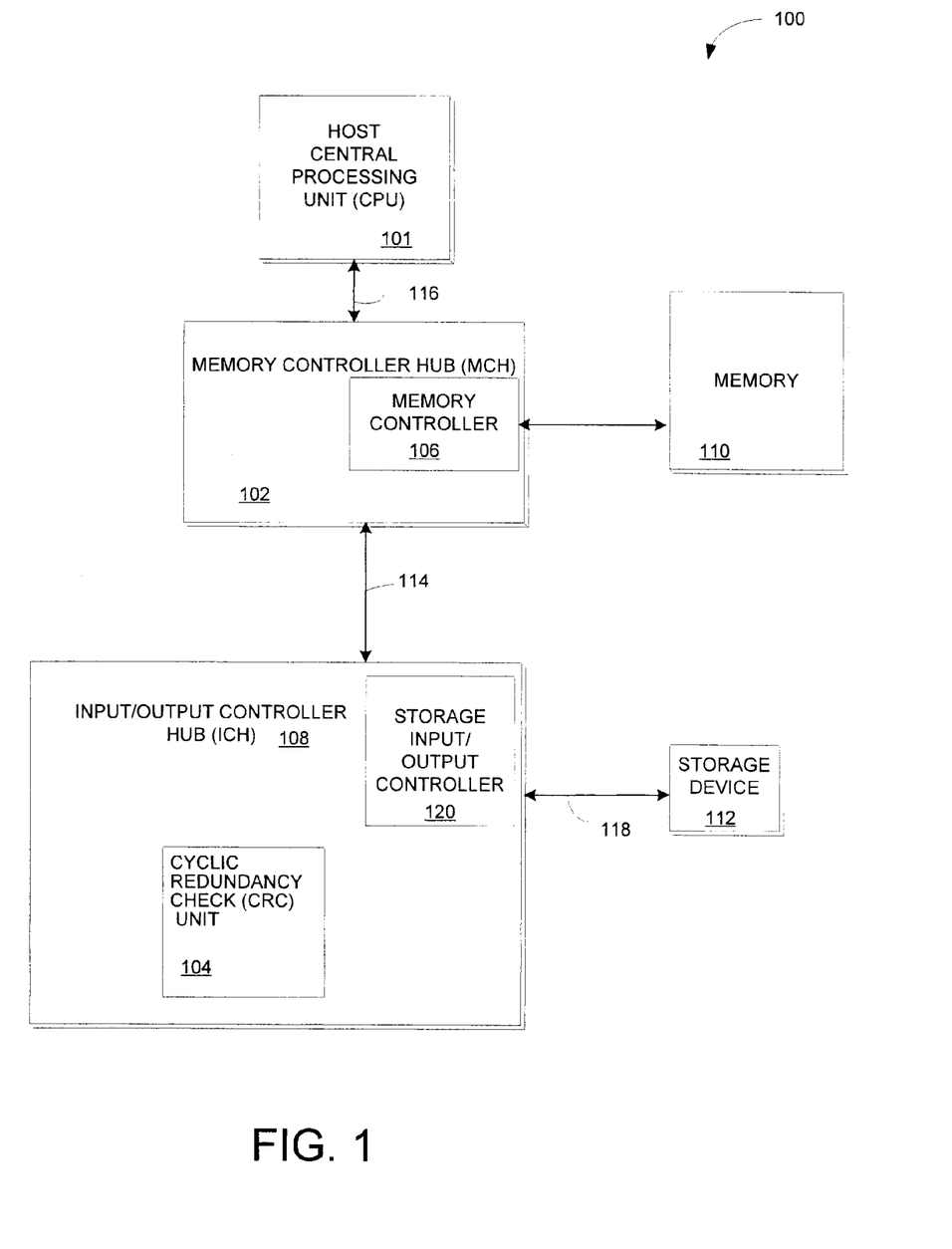
FIG. 1 illustrates an embodiment of a plurality of reduction stages used to compute a residue from a 64-bit input and a 32-bit CRC.

FIG. 1 is a block diagram of a system 100 that includes an embodiment of a Cyclic Redundancy Check (CRC) unit 104 that computes a fixed size remainder (a residue of binary division of an arbitrary length data block by a fixed size polynomial) according to the principles of the present invention.

The system 100 includes a processor 101, a Memory Controller Hub (MCH) 102 and an Input/Output (I/O) Controller Hub (ICH) 104. The MCH 102 includes a memory controller 106 that controls communication between the processor 101 and memory 110. The processor 101 and MCH 102 communicate over a system bus 116.

The processor 101 may be any one of a plurality of processors such as a single core Intel® Pentium IV® processor, a single core Intel Celeron processor, an Intel® XScale processor or a multi-core processor such as Intel® Pentium D, Intel® Xeon® processor, or Intel® Core® Duo processor or any other type of processor.

The memory 110 may be Dynamic Random Access Memory (DRAM), Static Random Access Memory (SRAM), Synchronized Dynamic Random Access Memory (SDRAM), Double Data Rate 2 (DDR2) RAM or Rambus Dynamic Random Access Memory (RDRAM) or any other type of memory.

The ICH 104 may be coupled to the MCH 102 using a high speed chip-to-chip interconnect 114 such as Direct Media Interface (DMI). DMI supports 2 Gigabit/second concurrent transfer rates via two unidirectional lanes. The ICH 104 includes the CRC unit 104. The ICH 104 may also include a storage I/O controller 120 for controlling communication with at least one storage device 112 coupled to the ICH 104. The storage device 112 may be, for example, a disk drive, Digital Video Disk (DVD) drive, Compact Disk (CD) drive, Redundant Array of Independent Disks (RAID), tape drive or other storage device. The ICH 104 may communicate with the storage device 112 over a storage protocol interconnect 118 using a serial storage protocol such as, Serial Attached Small Computer System Interface (SAS) or Serial Advanced Technology Attachment (SATA).

Figure 2:
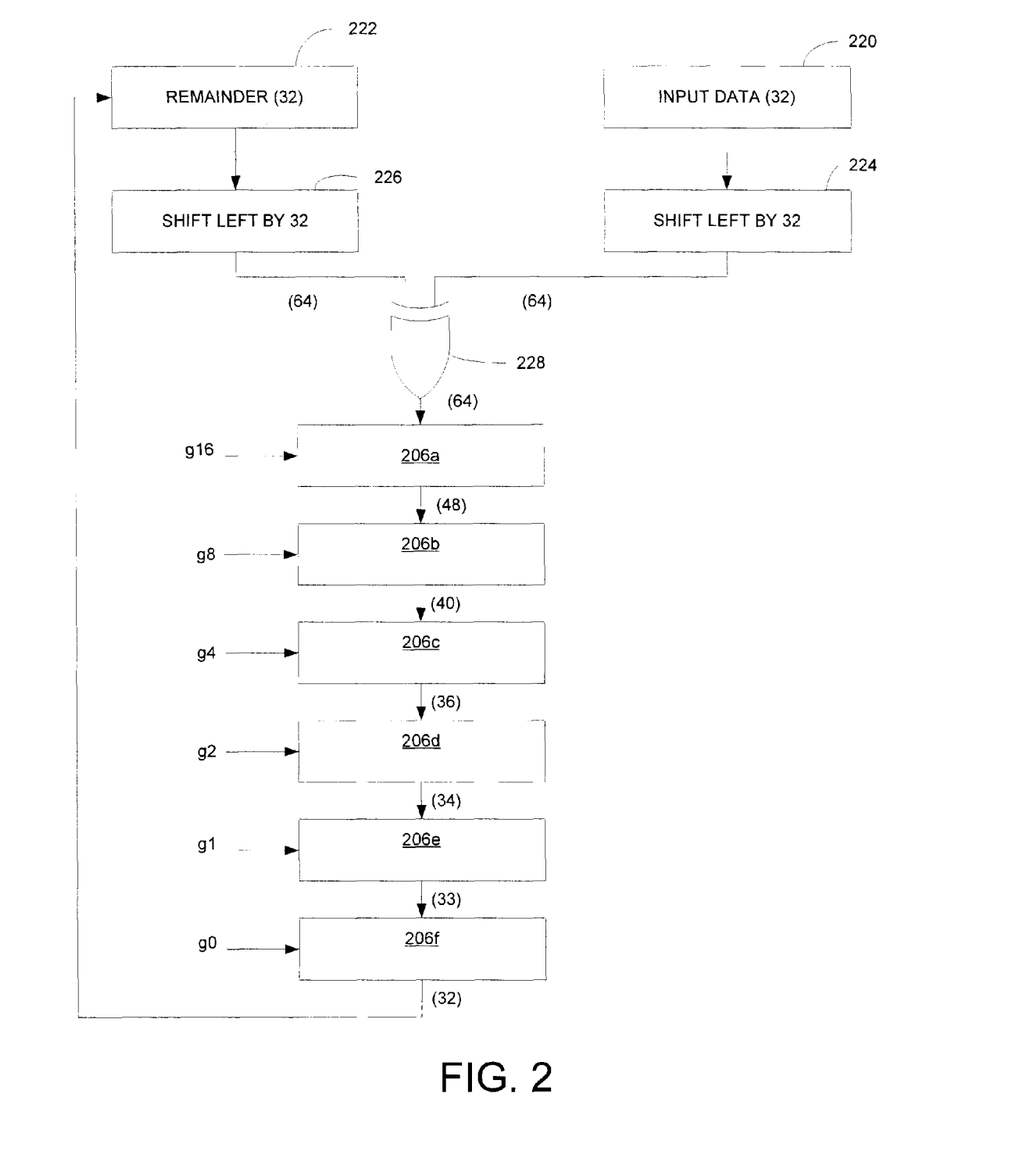
FIG. 2 illustrates an embodiment of the CRC circuit shown in FIG. 1.

FIG. 2 illustrates an embodiment of the CRC circuit shown in FIG. 1. Computing a CRC requires calculating the remainder resulting from the division of the input data by a generator value. In the embodiment shown in FIG. 2, a CRC is computed for a 32-bit segment 220 of a data stream. The 32-bit segment 220 is shifted by 32-bits 124 and an XOR operation 128 is performed with the 32-bit segment 202 and any pre-existing residue (remainder) 222 which is also shifted by 32-bits 226. The XORed result (input data) and the k-bits of the respective pre-computed polynomials $g_i(x)$ are used to compute the CRC residue in stages 206a-206f. Successive stages 206a-206e reduce input data by i-bits until a residue value is output by stage 206f. The residue is fed back 222 for use in processing the next 32-bit segment 220 of the data stream. The residue remaining after the final message portion 220 is applied is the CRC residue determined for the data stream as a whole. The CRC residue can either be appended to the data stream or compared with a received CRC value in the data stream to determine whether data corruption likely occurred.

Figure 3:
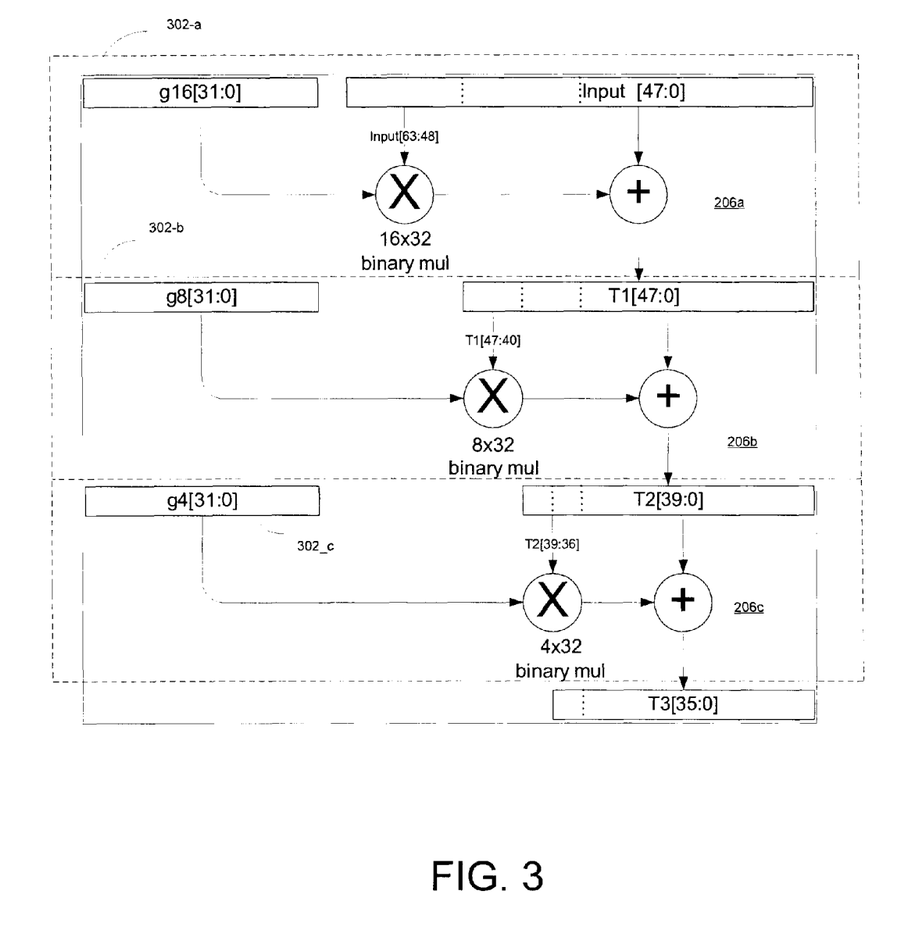
FIG. 3 illustrates an embodiment of the first three reduction stages shown in FIG. 2.

FIG. 3 illustrates an embodiment of the first three reduction stages 206a, 206b, 206c shown in FIG. 2. Pre-computed (fixed value) polynomials g16, g8 and g4 are derived from the 32-bit CRC and are each stored in a respective one of three storage elements 302a, 302b, 302c. The pre-computed polynomials are multiples of the 32-bit CRC polynomial over Galois Field (GF)(2). The storage elements 302a, ..., 302c may be registers or memory locations in a memory such as Dynamic Random Access Memory (DRAM), flash memory or any other type of memory.

The pre-computed polynomials g16, g8 and g4 are used to successively reduce a block of data (data segment) into smaller intermediate values in order to produce a CRC residue. The form of the pre-computed polynomials allows the plurality of stages to perform many of the calculations in parallel by processing mutually exclusive regions of the block of data in parallel. Performing calculations in parallel reduces the time to compute the CRC residue. For example, for a 32-bit input data block, g16 reduces the 16 Most Significant Bits of the 32-bit input data block, g8 reduces the next 8 MSBs and g4 reduces the next 4 MSBs. These reductions may be referred to as the various stages of the reduction.

Referring to FIG. 3, in the embodiment shown for a 64-bit input data segment, the first reduction stage 206a receives a 64-bit input data segment and reduces the input data segment using the g16 polynomial. First, a 16×32 multiply operation is performed with the 16 Most Significant Bits (MSB)s of the input data segment and the 32-bit polynomial g16. Next, an Exclusive OR (XOR) operation is performed on the 48-bit result of the multiply operation and the 48 Least Significant Bits (LSB)s of the input data segment to compute a 48-bit output from the first reduction stage 206a.

The second reduction stage 104-2 receives a 48-bit input data segment from the first stage 206a and reduces the input data segment using the g8 polynomial. First, an 8×32 multiply operation is performed using the 8 MSBs of the input data segment and the 32-bit g8 polynomial. Next, an XOR operation is performed using the 40-bit result of the multiply operation and the 40 Least Significant Bits (LSB)s of the input data segment to compute a 40-bit output that is forwarded to the third reduction stage 206c.

The third reduction stage 206c receives a 40-bit input from the second stage 206b and reduces the input data segment using the g4 polynomial. First, a 4×32 multiply operation is performed with the 4 MSBs of the 40-bit input data segment and the 32-bit g4 polynomial. Then, the third reduction stage performs an XOR operation with the 36-bit result of the multiply operation and the 36 Least Significant Bits (LSB)s of the 40-bit input to provide a 36 bit output that is forwarded to a next reduction stage 206d (FIG. 2) to continue to compute the residue.

The use of storage elements 302a, . . . , 302c to store pre-computed polynomials allows the 32-bit CRC to be selectable (programmable) through selection of the appropriate pre-computed polynomials that are loaded into the storage elements.

As shown in FIG. 3, each reduction stage 206a, . . . , 206 operates on operands with sizes (number of bits) that are asymmetric, that is, the multiplier and multiplicand have a different number of bits and the multiplier is decreased by half in each successive reduction stage (16, 8, 4). The sizes of the operands (multiplier, multiplicand) become more asymmetric with each successive stage. For example, the sizes of the input operands (multiplicand, multiplier) to the multiply operation in the various stages are 32:16 (first stage), 32:8 (second stage) and 32:4 (third stage).

The multiply operations in the reduction stages 206a-206c may be performed by a classical carry-less multiplication of the form i*32, however this is suboptimal. In an embodiment of the present invention, each of the plurality of reduction stages to produce a residue for a block of data is optimized to decrease area used to perform the reduction while maintaining the same delay through the plurality of reduction stages 206a, . . . 206f.

The schoolbook method to multiply two polynomials is to multiply each term of a first polynomial by each term of a second polynomial. For example, a first polynomial of degree 1 with two terms $a_1x+a_0$ may be multiplied by a second polynomial of degree 1 with two terms $b_1x+b_0$ by performing four multiply operations and three addition operations to produce a polynomial of degree 2 with three terms as shown below:

$$(a_1x+a_0)(b_1x+b_0)=a_1b_1x^2+(a_0b_1x+a_1b_0x)+a_1b_1$$

The number of multiply operations and Arithmetic Logical Unit (ALU) operations increases with the number of terms in the polynomials. For example, using the schoolbook method, the number of multiply operations to multiply two polynomials each having n terms is $n^2$ and the number of additions is $(n-1)^2$.

The Karatsuba algorithm (KA) reduces the number of multiply operations compared to the schoolbook method by multiplying two two-term polynomials $(A(x)=a_1x+a_0)$ and $B(x)=(b_1x+b_0))$, each having two coefficients $((a_1,a_0)$ and $(b_1,b_0))$, using three scalar multiplications instead of four multiplications as shown below:

$$C(x)=(a_1x+a_0)(b_1x+b_0)=a_1b_1x^2+((a_0+a_1)(b_0+b_1)-a_0b_0-a_1b_1)+a_0b_0$$

Thus, four additions and three multiplications are required to compute the result $C(x)$ of multiplying two two-term polynomials using the Karatsuba algorithm. The KA algorithm relies on the ability to perform shift operations faster than a standard multiplication operation.

The KA algorithm is typically applied to symmetric multiplications, where the operands (multiplier and multiplicand) are the same size. However, the multiply operations in reduction stages 206a, . . . , 206c are asymmetric. Furthermore, a naïve application of KA increases the critical path significantly while reducing area. In addition, there may be a number of levels of application of KA that typically range between 2 and 4. The number of levels is limited by the smaller of the operand sizes. For example, one or two levels of application of KA are optimal for computing the product of a 16-bit multiplier by a 32-bit multiplicand and one level of application of KA is optimal for computing the product of an 8-bit multiplier by a 32-bit multiplicand. A classical multiplier is optimal for computing a product of a 4-bit multiplier and a 32-bit multiplicand. In an embodiment of the present invention, the type of multiplication technique, multi-stage KA, single-stage KA or classical multiplier is selected for each stage based on the operand size.

Figure 4:
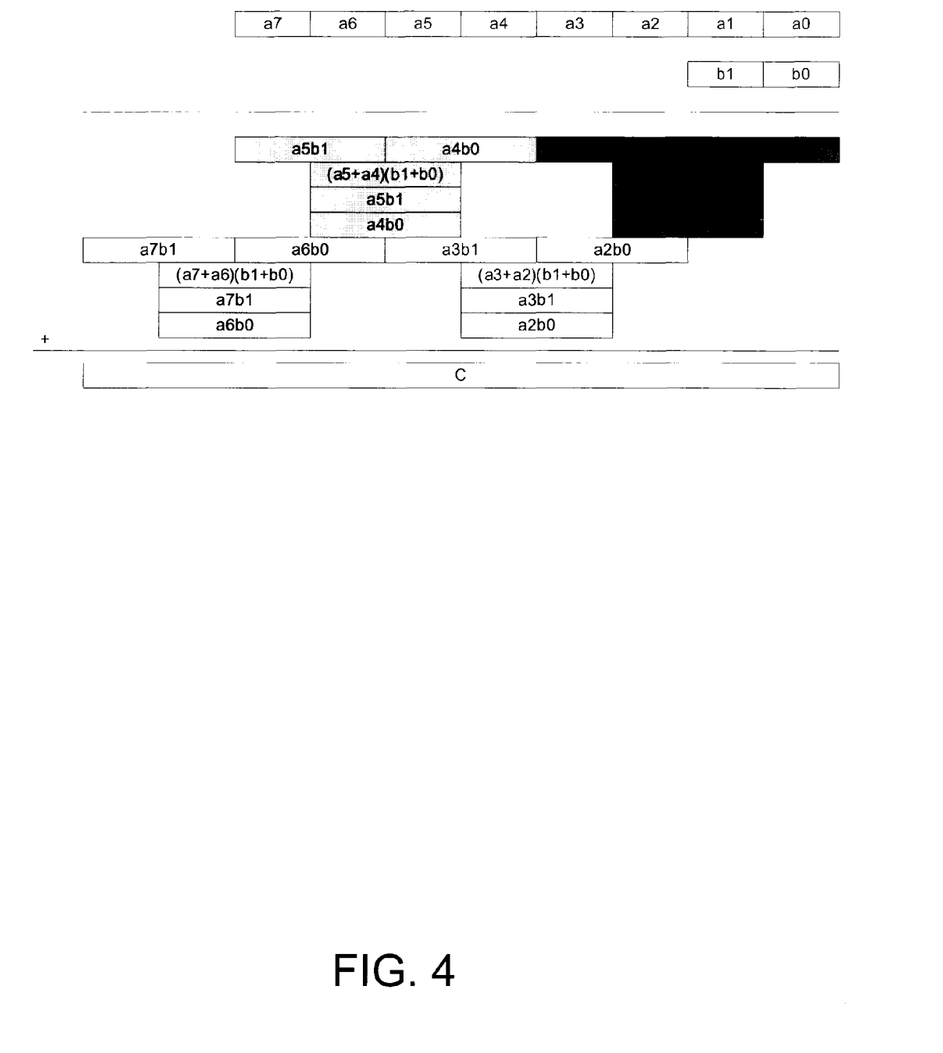
FIG. 4 illustrates an embodiment of a 8×32 multiplier that applies a one level application of Karatsuba (KA)

FIG. 4 illustrates an embodiment of an 8×32 multiplier that applies a one level application of Karatsuba (KA). The 8×32 multiplier may be used in the second reduction stage 206b shown in FIG. 3. As discussed earlier, the input data segment is reduced by 8-bits in the second reduction stage 206b. To perform the reduction by 8-bits, the multiplier applies a one level application of KA to perform a multiply operation on a 32-bit multiplicand (represented by A in FIG. 4) and an 8-bit multiplier (represented by B in FIG. 4).

The Karatsuba algorithm (KA) reduces the number of multiply operations compared to the schoolbook method by multiplying two two-term polynomials $(A(x)=a_1x+a_0)$ and $B(x)=(b_1x+b_0))$, each having two coefficients $((a_1,a_0)$ and $(b_1,b_0))$, using three scalar multiplications instead of four multiplications as shown below:

$$C(x)=(a_1x+a_0)(b_1x+b_0)=a_1b_1x^2+((a_0+a_1)(b_0+b_1)-a_0b_0-a_1b_1)+a_0b_0$$

Thus, four additions and three multiplications (that is, (1) $a_1b_1$, (2) $a_0b_0$, and (3) $((a_0+a_1)(b_0+b_1))$ are required to compute the result $C(x)$ of multiplying two two-term polynomials using the Karatsuba algorithm.

As shown in FIG. 4, the 32-bit multiplicand A is subdivided into eight 4-bit elements labeled a7-a0 and the 8-bit multiplier B is subdivided into two 4-bit elements labeled b1 and b0. The product C is A×B which is computed by applying KA to the following groups of elements of A and B:

(1) b1, b0 and a1, a0;
(2) b1, b0 and a2, a3;
(3) b1, b0 and a5, a4; and
(4) b1, b0 and a7, a6 in the order shown in FIG. 4.

The following four products (P0-P3) are computed by applying KA to elements in A and B.

$$P0=(a_1x+a_0)(b_1x+b_0)=a_1b_1x^2+((a_0+a_1)(b_0+b_1)-a_0b_0-a_1b_1)+a_0b_0$$

$$P1=((a_3x+a_2)(b_1x+b_0)=a_3b_1x^2+((a_2+a_3)(b_0+b_1)-a_2b_0-a_3b_1)+a_2b_0)2^8$$

$$P2=((a_5x+a_4)(b_1x+b_0)=a_5b_1x^2+((a_4+a_5)(b_0+b_1)-a_4b_0-a_1b_5)+a_4b_0)2^{16}$$

$$P3=((a_7x+a_6)(b_1x+b_0)=a_7b_1x^2+((a_6+a_7)(b_0+b_1)-a_6b_0-a_7b_1)+a_6b_0)2^{24}$$

As shown, P1 is shifted by eight bits, P2 is shifted by 16-bits and P3 is shifted by 24 bits. The products are then XORed to provide a 40-bit result C(x).

$$C(x)=P0+P1+P2+P3.$$

The worst case path for each product P0-P3 is the term that includes both multiplication and addition, for example, $((a_6+a_7)(b_0+b_1))$ when computing P3 or $((a_2+a_3)(b_0+b_1))$ when computing P1.

With a straightforward construction of an XOR tree after the core multipliers for the Karatsuba algorithm, the critical path delay of the multiplication circuit is the delay of the XOR operations before the core multipliers, delay of the core multiplier and the delay of the XOR tree. This may be reduced through the use of the asymmetric property of the Karatsuba Multiplier. For example, there are a different number of multiplication levels for computing different bits of the 40-bit result C(39:0). As shown in FIG. 4, the critical path is asymmetric with the lower order four bits C(3:0) of the result have one level of computation, C(7:0) and C(39:36) have four levels of computation, C(35:8) have five levels of computation. Also, as shown in FIG. 3, the Most Significant Bits (MSB)s of the input to each stage, for example, input[63:48] in the first level and input[47:0] in the next level are in the critical path because they are input to a multiplier with multiple levels of computation whereas the Least Significant Bits (LSBs) are only input to accumulators.

Thus, a critical path may be reduced for a particular bit or bits of the product by bypassing a multiplier. For example, any of product bits C[35:8] may be computed through a redundant set of XOR gates instead of through the Karatsuba multiplier, that is, the Karatsuba multiplier may be bypassed for these particular bits. The set of XOR gates may be used to compute $C[35]=a_{35}*b_0+a_{34}*b_1+a_{33}*b_0+a_{35}*b_2 \ldots a_0*b_{35}$ to reduce this critical path.

Figure 5:
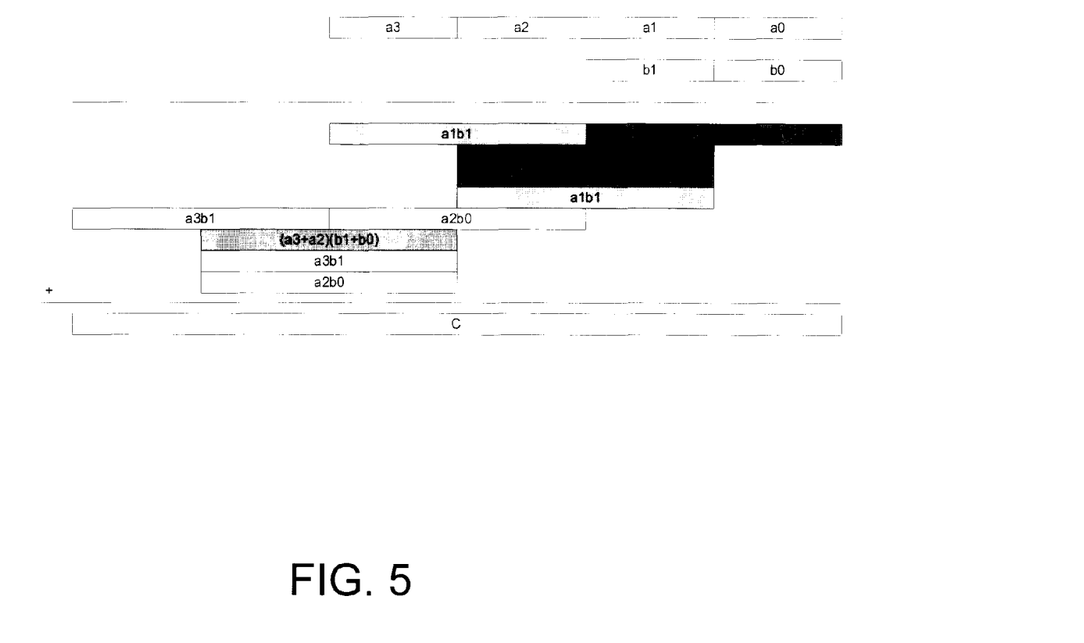
FIG. 5 illustrates an embodiment of a 16×32 multiplier that applies a one level application of Karatsuba (KA)

FIG. 5 illustrates an embodiment of a 16×32 multiplier that applies a one level application of Karatsuba (KA). The 16×32 multiplier may be used in the first reduction stage 206a shown in FIG. 3. As discussed earlier, the input data segment is reduced by 16-bits in the first reduction stage 206a. To perform the reduction by 16-bits, the multiplier applies a one level application of KA to perform a multiply operation on a 32-bit multiplicand (represented by A in FIG. 5) and an 16-bit multiplier (represented by B in FIG. 5).

As shown in FIG. 5, the 32-bit multiplicand A is subdivided into four 8-bit elements labeled a4-a0 and the 16-bit multiplier B is subdivided into two 8-bit elements labeled b1 and b0. The product C is A×B which is computed by applying KA to the following groups of elements of A and B:

(1) b1, b0 and a1, a0; and
(2) b1, b0 and a2, a3; in the order shown in FIG. 4.

The following two products (P0-P1) are computed by applying KA to elements in A and B.

$$P0=(a_1x+a_0)(b_1x+b_0)=a_1b_1x^2+((a_0+a_1)(b_0+b_1)-a_0b_0-a_1b_1)+a_0b_0$$

$$P1=((a_3x+a_2)(b_1x+b)=a_3b_1x^2+((a_2+a_3)(b_0+b_1)-a_2b_0-a_3b_1)+a_2b_0)2^{16}$$

As shown, P1 is shifted by sixteen bits. The products are then XORed to provide a 48-bit result C(x).

$$C(x)=P0+P1+P2+P3.$$

The worst case path for each product P0-P1 is the term that includes both multiplication and addition, for example, $((a_2+a_3)(b_0+b_1))$ when computing P1. As discussed in conjunction with FIG. 4, the critical path delay may be reduced through the use of the asymmetric property of the Karatsuba Multiplier.

Figure 6:
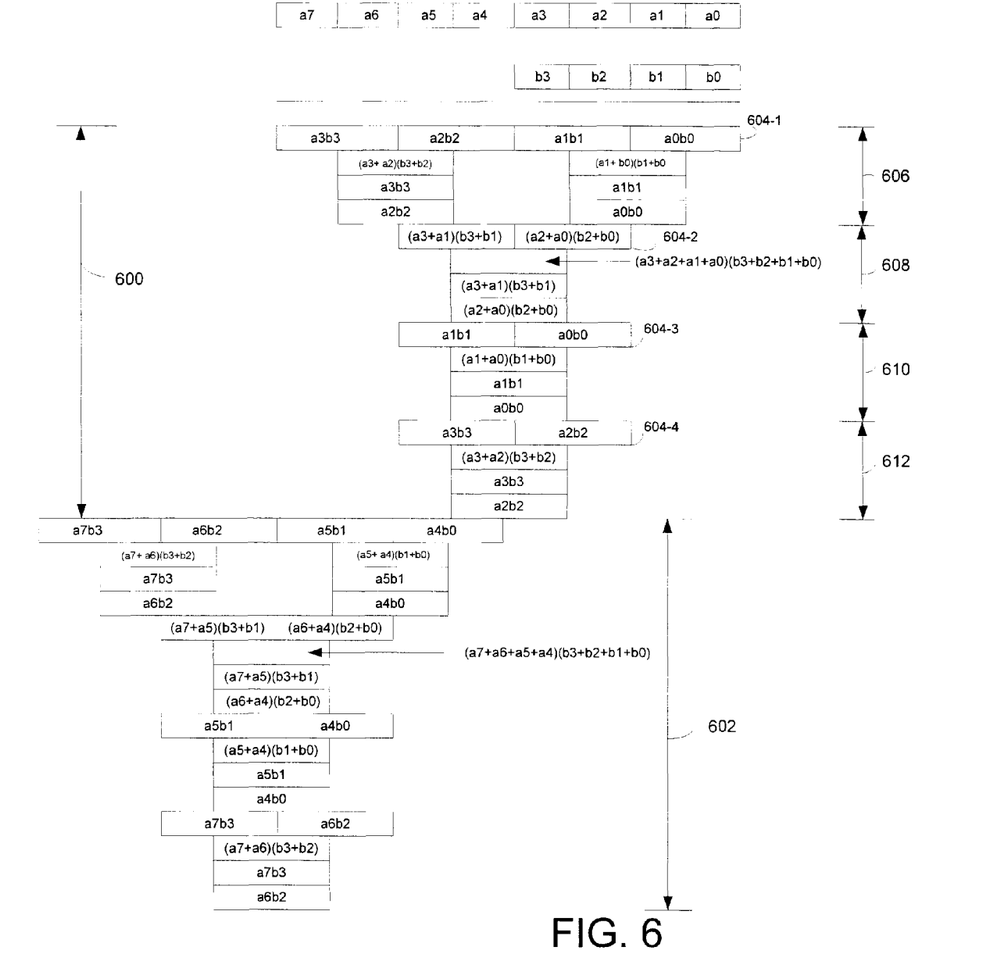
FIG. 6 illustrates an embodiment of a 16×32 multiplier that applies a two level application of Karatsuba (KA)

FIG. 6 illustrates an embodiment of a 16×32 multiplier that applies a two level application of Karatsuba (KA). The 16×32 multiplier may be used in the first reduction stage 206a shown in FIG. 3. As discussed earlier, the input data segment is reduced by 16-bits in the first reduction stage 206a. To perform the reduction by 16-bits, the multiplier applies a two level application of KA to perform a multiply operation on a 32-bit multiplicand (represented by A in FIG. 6) and an 16-bit multiplier (represented by B in FIG. 6).

As shown in FIG. 6, the 32-bit multiplicand A is subdivided into eight 4-bit elements labeled a7-a0 and the 16-bit multiplier B is subdivided into four 4-bit elements labeled b3-b0. The product C is A*B which is computed by applying a two level KA 600 to the following groups of elements of A and B to compute (b3: b0)*(a3:a0) which is a symmetric multiplication, that is, each operand has the same number of bits:

(1) b1, b0 and a1, a0; and
(2) b1, b0 and a2, a3.

Then applying a two level KA 602 to the following groups of elements of A and B to compute (b3:b0)*(a7:a4) which is also symmetric multiplication, that is, each operand has the same number of bits:

(1) b1, b0 and a4, a5; and
(2) b1, b0 and a6, a7.

Both two level KAs 600, 602 are performed in the same manner with different groups of elements of A and B. Thus, only one of the two level KAs, two level KA 600 will be described here.

A first level KA is applied to elements b3:b0 in B and elements a3:a0 in A to generate first level KA elements 604-1, 604-2, 604-3 and 604-4 as shown in FIG. 6. A second level KA is then applied to each of these first level KA elements 604-1, 604-2, 604-3 and 604-4. These second level KAs are labeled 606, 608, 612 and 614 in FIG. 6 for ease of reference. A KA is applied to elements a3, b3, a2, b2 and a separate KA is applied to elements a1, b1, a0, b0 generated by the first level KA in second level KA labeled 606. A KA is applied to first level KA element 604-2 in second level KA labeled 608. A KA is applied to first level KA element 604-3 in second level KA labeled 610. A KA is applied to first level KA element 604-4 in second level KA labeled 612.

The worst case path is the term that includes both multiplication and addition, for example, (a3+a2+a1+a0).(b3+b2+ b1+b0). As discussed earlier in conjunction with FIG. 4, the critical path delay may be reduced through the use of the asymmetric property of the Karatsuba Multiplier.

The area savings are even greater as the number of bits in the CRC polynomial is increased, for example, a 64 bit CRC polynomial instead of a 32 bit CRC polynomial. The reduction in area is dependent on the size of the CRC reduction circuit.

Figure 7:
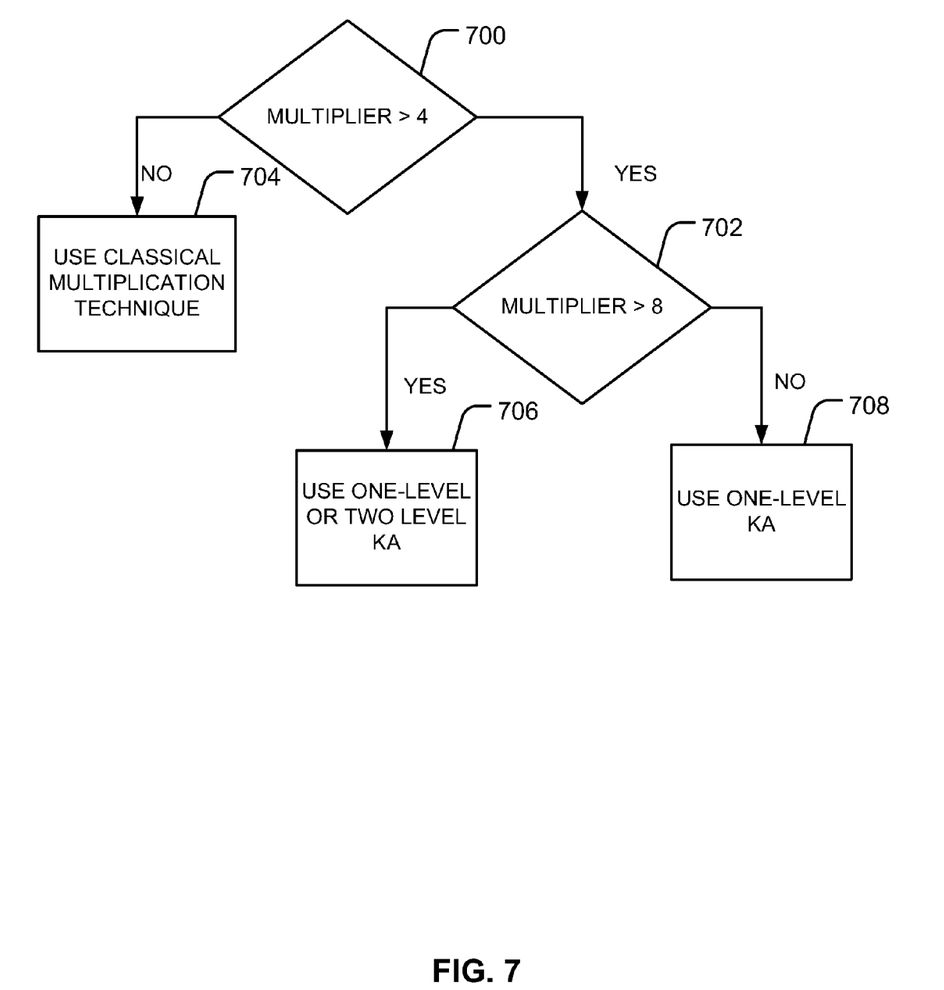
FIG. 7 is a flowgraph illustrating an embodiment of a method for selecting an optimal multiplication algorithm to be used a reduction stage used to compute a CRC residue.

FIG. 7 is a flowgraph illustrating an embodiment of a method for selecting an optimal multiplication algorithm to be used a reduction stage that is used to compute a CRC residue.

At block 700, if the size of the multiplier for the reduction stage is greater than four, processing continues with block 702. If not, processing continues with block 704.

At block 702, if the size of the multiplier is greater than eight, processing continues with block 706. If not, processing continues with block 708.

At block 704, a classical multiplication technique is selected to compute the product in the reduction stage.

At block 706, a one level application of Karatsuba (KA) is selected to compute the product in the reduction stage.

At block 708, either a one level application of Karatsuba or a two-level application of Karatsuba is selected to compute the product in the reduction stage.

It will be apparent to those of ordinary skill in the art that methods involved in embodiments of the present invention may be embodied in a computer program product that includes a computer usable medium. For example, such a computer usable medium may consist of a read only memory device, such as a Compact Disk Read Only Memory (CD ROM) disk or conventional ROM devices, or a computer diskette, having a computer readable program code stored thereon.

While embodiments of the invention have been particularly shown and described with references to embodiments thereof, it will be understood by those skilled in the art that various changes in form and details may be made therein without departing from the scope of embodiments of the invention encompassed by the appended claims.

The invention claimed is:

1. An apparatus comprising:
a plurality of reduction stages, each one of the plurality of the reduction stages to compute a product of a first operand with a first size and a second operand with a second size, wherein the first size and the second size are different sizes;
wherein the first size of the first operand corresponds to one of the plurality of reduction stages;
wherein each reduction state uses a multiplication algorithm in view of the size of the first operand;
wherein when the first size of the first operand is less than or equal to a first threshold size, then the multiplication algorithm used to compute the product of the first operand and the second operand is a classical multiplication technique;
wherein when the first size of the first operand is greater than the first threshold size, then the multiplication algorithm used to compute the product of the first operand and the second operand is a one level application of a Karatsuba (KA) multiplication technique or a two level application of the KA multiplication technique; and
wherein the first threshold value is four bits.

2. The apparatus of claim 1, wherein when the first size of the first operand is 16 bits then the multiplication algorithm used to compute the product of the first operand and the second operand is the one level application of the KA multiplication technique or the two level application of the KA multiplication technique.

3. The apparatus of claim 1, wherein when the first size of the first operand is 8 bits then the multiplication algorithm used to compute the product of the first operand and the second operand is the one level application of the KA multiplication technique or the two level application of the KA multiplication technique.

4. The apparatus of claim 1, wherein when the first size of the first operand is greater than the first threshold size and less than a second threshold size, then the multiplication algorithm applies the one level application of the KA multiplication technique or the two level application of the KA multiplication technique, wherein the second threshold size is greater than the first threshold size.

5. The apparatus of claim 4, wherein the second size of the second operand is 32 bits and the first size of the first operand is 16 bits.

6. A method comprising:
providing a cyclic redundancy check unit coupled to a dynamic random access memory, the cyclic redundancy check unit comprising a plurality of reduction stages, each of the plurality of the reduction stages to compute a product of a multiplier with a first size and a multiplicand with a second size, wherein the first size and the second size are different sizes; and
selecting a multiplication algorithm for each reduction stage to compute the product in view of the first size of the multiplier,
wherein the first size of the multiplier corresponds to one of the plurality of reduction stages;
wherein when the first size of the multiplier is less than or equal to a first threshold value, then the multiplication algorithm used to compute the product is a classical multiplication technique,
wherein when the first size of the multiplier is greater than the first threshold value, then the multiplication algorithm used to compute the product is a one level application of Karatsuba (KA) or a two level application of KA; and
wherein the first threshold value is four bits.

7. The method of claim 6, wherein the multiplicand is 32 bits and the multiplier is 16 bits.

8. The method of claim 6, wherein the multiplicand is 32 bits and the multiplier is 8 bits.

9. The method of claim 6, wherein when the first size of the multiplier is greater than the first threshold value and less than a second threshold value, then the multiplication algorithm applies the one level application of KA or the two level application of KA, wherein the second threshold value is greater than the first threshold value.

10. The method of claim 9, wherein the multiplicand is 32 bits and the multiplier is 16 bits.

11. A system comprising:
a dynamic random access memory; and
a cyclic redundancy check unit coupled to the dynamic random access memory, the cyclic redundancy check unit comprising:
a plurality of reduction stages, each of the plurality of the reduction stages to compute a product of a multiplier with a first size and a multiplicand with a second size, wherein the first size and the second size are different sizes;
wherein the first size of the multiplier corresponds to one of the plurality of reduction stages;

wherein each reduction state uses a multiplication algorithm in view of the first size of the multiplier;

wherein when the first size of the multiplier is less than or equal to a first threshold value, then the multiplication algorithm used to compute the product is a classical multiplication technique;

wherein when the first size of the multiplier is greater than the first threshold value, then the multiplication algorithm used to compute the product is a one level application of Karatsuba (KA) or a two level application of KA; and wherein the first threshold value is four bits.

12. The system of claim 11, wherein the multiplicand is 32 bits and the multiplier is 16 bits.

13. The system of claim 11, wherein the multiplicand is 32 bits and the multiplier is 8 bits.

14. The system of claim 11, wherein when the first size of the multiplier is greater than the first threshold value and less than a second threshold value, then the multiplication algorithm applies the one level application of KA or the two level application of KA, wherein the second threshold value is greater than the first threshold value.

15. The system of claim 14, wherein the multiplicand is 32 bits and the multiplier is 16 bits.

* * * * *